United States Patent [19]

Iwanami

[11] 4,215,322
[45] Jul. 29, 1980

[54] HIGH FREQUENCY OSCILLATING CIRCUIT USING AT CUT QUARTZ CRYSTAL VIBRATOR

[75] Inventor: Eiichi Iwanami, Tokyo, Japan

[73] Assignee: Kabushiki Kaisha Daini Seikosha, Japan

[21] Appl. No.: 933,093

[22] Filed: Aug. 11, 1978

[30] Foreign Application Priority Data

Aug. 29, 1977 [JP] Japan ................................ 52/103394

[51] Int. Cl.² .......................... H03B 5/36; H03F 3/16
[52] U.S. Cl. .............................. 331/116 FE; 330/277; 330/300; 330/307
[58] Field of Search ....................... 330/277, 300, 307; 331/116 FE

[56] References Cited

U.S. PATENT DOCUMENTS

4,080,577  3/1978  Asada et al. ...................... 330/307

*Primary Examiner*—James B. Mullins
*Attorney, Agent, or Firm*—Robert E. Burns; Emmanuel J. Lobato; Bruce L. Adams

[57] ABSTRACT

A high frequency oscillating circuit comprises an integrated circuitry composed of first and second lateral type transistors and a longitudinal type junction field effect transistor formed in a semiconductor layer of low impurity concentration epitaxially grown on a semiconductor substrate of high impurity concentration. An AT cut quartz crystal vibrator operable at a high oscillating frequency of more than several MHz is connected to the integrated circuitry, and a pair of capacitors are provided to adjust the vibrator oscillating frequency.

2 Claims, 4 Drawing Figures

HIGH FREQUENCY OSCILLATING CIRCUIT USING AT CUT QUARTZ CRYSTAL VIBRATOR

BACKGROUND OF THE INVENTION

The present invention relates to an oscillating circuit comprised of integrated circuitry which operates at a voltage lower than the built-in voltage of the PN junctions forming the integrated circuitry.

Recently, quartz crystal timepieces have been in popular use owing to their high precision. Particularly, X-cut quartz crystal vibrators having secondary temperature coefficients whose top temperature is near room temperature are in general use because of their low natural frequency of around 32 KHz and their capability of being small sized. However, it is difficult for this type of quartz crystal vibrator to achieve the desired time accuracy such as error of several seconds per a year, and thereby an AT cut quartz crystals having tertiary temperature coefficients are usually required. However, since the frequency band of the AT cut quartz crystal is more than several MHz, the power consumption of the AT cut quartz crystal of C-MOS or I²L construction such as are conventionally used is large and consequently a battery life of more than several years for a wrist watch cannot presently be satisfied.

Accordingly, the present invention aims to provide a quartz crystal oscillating circuit which operates at a voltage lower than the built-in voltage of the circuit PN junctions.

DETAILED DESCRIPTION OF INVENTION

Figure 1:
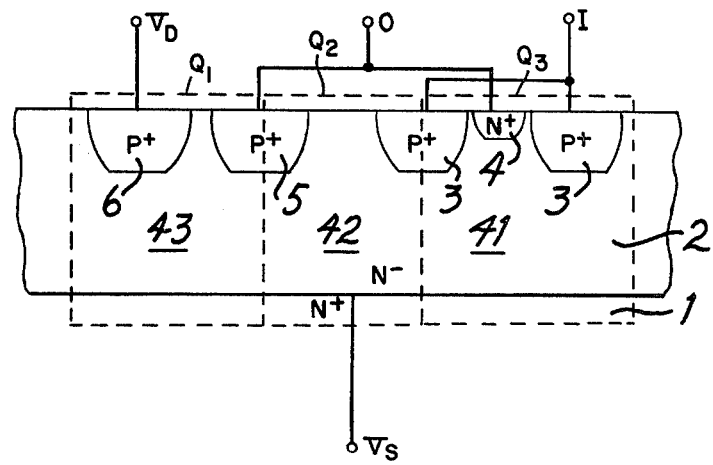
FIG. 1 shows a sectional view of a semiconductor amplifying circuit according to the present invention.

Hereafter, the present invention will be illustrated in conjunction with the drawings. FIG. 1 shows a sectional view of a semiconductor illustrating the present invention, wherein numeral 1 is an N+ semiconductor substrate layer of high concentration, numeral 2 is an N conductivity type material epitaxial layer of low concentration provided on the N+ semiconductor layer 1 by the gaseous phase growth method, numeral 3 is a gate region of a longitudinal type junction electric field effect transistor VFET $Q_3$ provided on the epitaxial layer 2 by diffusion as well as P+ semiconductor region which forms a collector of a lateral type transistor $Q_2$. Numeral 4 is a drain region of the VFET $Q_3$ provided on the epitaxial layer 2 within the region of N+ conductivity type material by diffusion. The depth of the drain 4 is shallower than that of the P+ semiconductor region 3 which extends around the region 4. A portion 41 which is a part of the epitaxial layer 2 defines a channel region of the VFET $Q_3$ and the N+ semiconductor layer 1 defines a source region. Numeral 5 is a P+ semiconductor region provided on the epitaxial layer 2 by diffusion which forms the collector of a lateral type transistor $Q_1$ as well as an emitter of the second lateral transistor $Q_2$. Numeral 6 is a P+ conductivity material formed by diffusion as an emitter of the first lateral type transistor $Q_1$. Numerals 42 and 43 designate portions of the epitaxial layer 2 which define base regions of the first and the second lateral type transistors $Q_1$ and $Q_2$ and are grounded by way of a ground terminal VS. If the N+ semiconductor layer 1 is grounded under the condition that the emitter 6 of the first transistor $Q_1$ is connected to a power source VD, and the P+ semiconductor region 3 acting as the collector and emitter of the first and second transistors $Q_1$ and $Q_2$ functions as an input terminal I, the equivalent circuit for the construction shown in FIG. 1 is as shown in FIG. 2.

A description will now be given of the circuit operation according to the equivalent circuit in FIG. 2. A bias circuit of the VFET $Q_3$ is composed of the first and second lateral type transistors $Q_1$ and $Q_2$. The area of the corresponding emitter and the collector is decided so that the collector current of the first transistor $Q_1$ of the bias point is approximately equal to the drain current ID of the VFET $Q_3$. The second transistor $Q_2$ is selected so that the collector current becomes extremely small, i.e. becomes the equivalent of a high resistance in comparison with the first transistor $Q_1$. The VFET $Q_3$ thus comprises an amplifying element which operates under the control of the channel between the drain region 4 and the N+ semiconductor layer 1 which acts as a source by formation of a depletion layer between the P+ semiconductor region 3 acting as the gate of the VFET $Q_3$ and the epitaxial layer shown in FIG. 1 with the voltage in the normal direction of the gate against the source, and the predetermined drain current ID and mutual conductance Gn determined by the load connected to the output terminal O are determined by the interval and the width of the P+ semiconductor region 3 which forms the gate of the VFET $Q_3$ shown in FIG. 1. The amplifying circuit composed in this way is self-biasing type and therefore the stability thereof is high and the minimum operating voltage thereof is low and the circuit can be easily integrated as an integrated circuit.

Figure 2:
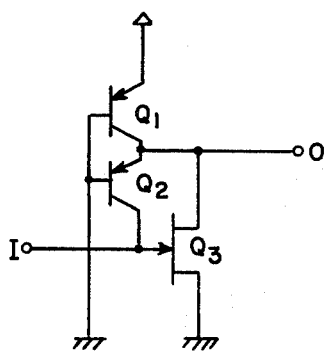
FIG. 2 shows an equivalent circuit of the amplifying circuit shown in FIG. 1.
Figure 3:
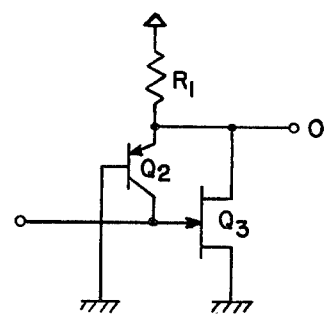
FIG. 3 shows an amplifying circuit in which the first transistor $Q_1$ shown in FIG. 2 is replaced by a fixed resistance and, FIG. 4 shows a quartz crystal oscillating circuit using a amplifying circuit according to the present invention.

In FIG. 3 the first transistor of the amplifying circuit shown in FIG. 2 is replaced by a fixed resistor $R_1$. In case the amplifying circuit shown in FIG. 3 is used as a quartz crystal oscillating circuit, the resistor $R_1$ has a resistance value several ten K ohms when the frequency of the quartz crystal oscillating circuit is 4 MHz and several hundred K ohms when the frequency of the quartz crystal oscillating circuit is 32 KHz and such resistances can easily be replaced by the P-diffusion of the integrated circuit, and thereby the embodiment to replace the first transistor $Q_1$ by the fixed resistance $R_1$ is advantageous if the diffusion resistor is provided without increasing the number of production processes of the integrated circuit.

Figure 4:
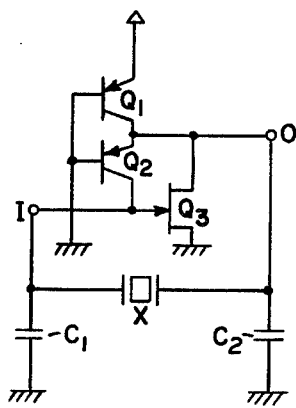

FIG. 4 shows the amplifying circuit according to the present invention embodied in a quartz crystal oscillating circuit. An AT cut quartz crystal vibrator X is connected between the input terminal I and the output terminal O of the amplifying circuit and capacitors or condensors $C_1$ and $C_2$ are connected between each of the terminals and ground. The quartz crystal oscillating circuit of this composition amply secures the precision of the quartz crystal vibrator and the output amplitude, and is therefore quite suitable for use in a quartz crystal watch or other timepiece.

As described so far, the quartz crystal oscillating circuit using the amplifying circuit according to the present invention coexists with the logical elements of low power consumption and operates at a voltage lower than the various PN junction built-in voltages recently proposed in integrated circuits and thereby the inventive quartz crystal oscillating circuit is able to contribute to the manufacture of quartz crystal watches of high precision and long life.

I claim:

1. An oscillating circuit for use in a timepiece and the like comprising: a semiconductor substrate of one conductivity type having a high impurity concentration; an epitaxial semiconductor layer of the same conductivity type as said substrate formed on said substrate and having a low impurity concentration; a first region of the same conductivity type as the substrate formed in a surface portion of said epitaxial layer; a second region of the opposite conductivity type formed in a surface portion of said epitaxial layer around said first region and having a high impurity concentration; a third region of the same conductivity type as said second region formed in a surface portion of said epitaxial layer a short distance from said second region; a fourth region of the same conductivity type as said second region formed in a surface portion of said epitaxial layer a short distance from said third region;

said substrate, first region, the portion of said epitaxial layer under said first region, and second region forming respectively the source, drain, channel and gate regions of a longitudinal junction field effect transistor;

said second region, third region and the portion of said epitaxial layer between said second and third regions forming respectively the collector, emitter and base regions of one lateral transistor; and said fourth region, third region and the portion of said epitaxial layer between said third and fourth regions forming respectively the emitter, collector and base regions of another lateral transistor; a quartz crystal vibrator operable at a high oscillating frequency of more than several MHz; means including first and second capacitors connected to said vibrator for adjusting the vibrator oscillating frequency; an input terminal connected to said second region; a common output terminal connected to said first and third regions; means connecting said first capacitor between said input terminal and said substrate; and means connecting said second capacitor between said output terminal and said substrate.

2. An oscillating circuit according to claim 1; wherein said quartz crystal vibrator comprises an AT cut quartz crystal vibrator.

* * * * *